(12) United States Patent
Miyanagi

(10) Patent No.: US 9,355,930 B2
(45) Date of Patent: May 31, 2016

(54) SEMICONDUCTOR DEVICE

(71) Applicant: FUJI ELECTRIC CO., LTD., Kawasaki-shi (JP)

(72) Inventor: Toshiyuki Miyanagi, Azumino (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/645,969

(22) Filed: Mar. 12, 2015

(65) Prior Publication Data

US 2015/0187674 A1 Jul. 2, 2015

Related U.S. Application Data

(63) Continuation of application No. PCT/JP2013/081162, filed on Nov. 19, 2013.

(30) Foreign Application Priority Data

Dec. 18, 2012 (JP) .................................. 2012-275246

(51) Int. Cl.
| | |
|---|---|
| *H01L 23/28* | (2006.01) |
| *H01L 23/34* | (2006.01) |
| *H01L 25/07* | (2006.01) |
| *H01L 25/18* | (2006.01) |
| *H01L 23/29* | (2006.01) |
| *H01L 23/31* | (2006.01) |

(52) U.S. Cl.
CPC .............. *H01L 23/34* (2013.01); *H01L 23/295* (2013.01); *H01L 23/296* (2013.01); *H01L 23/3107* (2013.01); *H01L 23/3121* (2013.01); *H01L 25/07* (2013.01); *H01L 25/18* (2013.01); *H01L 2224/45144* (2013.01); *H01L 2224/4846* (2013.01); *H01L 2924/1305* (2013.01); *H01L 2924/13055* (2013.01); *H01L 2924/13091* (2013.01)

(58) Field of Classification Search
CPC ..... H01L 23/34; H01L 23/296; H01L 23/295; H01L 2924/13055; H01L 33/56; H01L 21/56; H01L 2224/4846
USPC ........... 257/787, 791, 795; 438/112, 124, 127
See application file for complete search history.

(56) References Cited

U.S. PATENT DOCUMENTS

| | | | | |
|---|---|---|---|---|
| 5,349,240 | A | * 9/1994 | Narita | ..................... H01L 23/24 257/787 |
| 2004/0102023 | A1 | * 5/2004 | Morozumi | .......... H01L 23/3735 438/460 |

FOREIGN PATENT DOCUMENTS

| | | |
|---|---|---|
| JP | 62021249 A | 1/1987 |
| JP | 05129474 A | 5/1993 |
| JP | 2009212342 A | 9/2009 |
| JP | 2011222869 A | 11/2011 |

OTHER PUBLICATIONS

International Search Report issued in PCT/JP2013/081162, mailed Feb. 18, 2014. English translation provided.

* cited by examiner

*Primary Examiner* — Jarrett Stark
*Assistant Examiner* — Shahed Ahmed
(74) *Attorney, Agent, or Firm* — Rossi, Kimms & McDowell LLP

(57) ABSTRACT

A surface of a power semiconductor chip, mounted within a power semiconductor module and not being opposed to a wiring thin film, and a surface of a bonding wire are sealed with a resin that does not contain a thermally-conductive filler, and the resin that does not contain a thermally-conductive filler is sealed with a resin that contains a thermally-conductive filler.

14 Claims, 4 Drawing Sheets

SEMICONDUCTOR DEVICE

CROSS-REFERENCE TO RELATED APPLICATIONS

This application is a continuation of International Application No. PCT/JP2013/081162, filed on Nov. 19, 2013, and is based on and claims priority to Japanese Patent Application No. JP 2012-275246, filed on Dec. 18, 2012. The disclosure of the Japanese priority application and the PCT application in their entirety, including the drawings, claims, and the specification thereof, are incorporated herein by reference.

BACKGROUND

1. Technical Field

Embodiments of the present invention relate to a semiconductor device and specifically to a power semiconductor module where a power semiconductor chip is mounted.

2. Discussion of the Background

Semiconductor devices called power semiconductor modules, where plural power semiconductor chips such as insulating gate bipolar transistors (IGBTs), power metal-oxide-semiconductor field-effect transistors (MOSFETs), and freewheeling diodes (FWDs) are mounted, and which are used for electrical power control in inverters or the like, have been widely used in industrial fields.

In the power semiconductor module, in order to protect an insulating substrate having a wiring thin film and the power semiconductor chips bonded on the wiring thin film by solder, which are arranged within a resin case, the resin case is sealed by filling a sealing resin such as silicone gel. With this silicone gel, an insulating property (dielectric breakdown voltage) within the resin case is ensured.

On the other hand, because the power semiconductor chips generate high heat during operation, it becomes important to enhance a cooling performance for the power semiconductor chips in ensuring a long-term reliability of the power semiconductor modules. To this end, in an existing power semiconductor module, a base plate made of metal is bonded by solder on a reverse side of the insulating substrate for holding the power semiconductor chips, and further cooling fins are added, thereby to enhance the cooling performance.

FIG. 4 is a principal part cross-sectional view of an existing power semiconductor module 100. Power semiconductor chips 1 are bonded by solder (not illustrated) on a wiring thin film 2 provided on an upper surface of an insulating substrate 3 made of an insulating material such as alumina. Incidentally, the wiring thin film 2 is generally made of copper or copper alloy.

In addition, because electrical power is controlled by flowing electric current in a thickness direction of the semiconductor chip in the power semiconductor chips 1, there exist electrodes having different functions on respective chip surfaces. Thus, it is required to provide a different wiring on a surface of the semiconductor chip, the surface being opposite to a surface that faces the wiring thin film. As this different wiring, bonding wires 6, which are generally made of copper, aluminum, gold, or the like, are used.

Moreover, in order to ensure the cooling performance for the heat generated from the power semiconductor chips 1, the insulating substrate 3 and a metal base plate 5, which is made of copper, aluminum, or the like, are firmly attached to each other. Incidentally, when the solder is used as a firmly attaching measure, a metal thin film 4 made of copper, copper alloy, or the like becomes further necessary on the reverse side of the insulating substrate 3, as illustrated in FIG. 4.

After the above configuration and various wirings (not illustrated) are incorporated into a case frame 7, a sealing resin A made of silicone gel is filled thereinto, and then a case lid 8 is attached, thereby to complete the power semiconductor module 100.

However, in the existing power semiconductor module 100, while the insulating substrate 3 and the metal base plate 5 are capable of contributing to heat dissipation because of their high thermal conductivities as illustrated in FIG. 5, the silicone gel for sealing (sealing resin A) scarcely contributes to the heat dissipation because of its low thermal conductivity. Therefore, when a large amount of heat is generated from the power semiconductor chips 1, such as in a case where the power semiconductor chips 1 are used at a high current, a sufficient cooling performance is not ensured, which may lead to a problem in a long-term reliability.

So, it has been known that by adding a filler having an insulating property and a high thermal conductivity to the silicone gel for sealing the cooling performance is improved, as disclosed in Japanese Publication JP-A-5-129474 and Japanese Publication JP-A-62-21249. A power semiconductor module 110 that has silicone gel, to which the filler is added, uses a sealing resin B whose thermal conductivity is improved by adding the filler such as silica, alumina, and diamond to the silicone gel of the filler, while maintaining the insulating property, as illustrated in FIG. 6. With this, in the power semiconductor module 110, because the heat dissipation from both surfaces of the power semiconductor chips 1 can be ensured, as illustrated in FIG. 7, the cooling performance is improved.

On the other hand, because an influence of thermal stress cannot be ignored in the silicone gel containing the thermally-conductive filler, compared with the silicone gel in the past, there may be caused a problem of peeling off in protrusion electrodes fixed and supported by the substrate or the semiconductor chip. So, as is a power semiconductor module 120 illustrated in FIG. 8, it has also been reported that the sealing resin A made of the silicone gel in the past is used in the vicinity of protrusion electrodes 11, and a sealing resin B containing the fillers there above is used (Japanese Publication JP-A-62-21249).

SUMMARY OF INVENTION

In Japanese Publication JP-A-5-129474 and Japanese Publication JP-A-62-21249, the sealing resin B containing a thermally-conductive filler is used to seal a surface of the power semiconductor chip, the surface not being opposed to the wiring thin film and surfaces of the bonding wires, as illustrated in FIG. 6 and FIG. 8.

However, as a result of vigorous researches by the inventors of the present invention, it has been revealed that there may be caused a problem in the long-term reliability in such a case. The causes are as follows. When the power semiconductor module is operated, a temperature cycle deriving from generation loss is caused, which results in generations of micro vibrations of the power semiconductor chip due to thermal contractions of the insulating substrate and the metal base plate, and micro vibrations due to thermal contractions of the bonding wires per se.

On the other hand, because the above-described thermally-conductive filler generally has a high degree of hardness, when micro vibrations are generated in the power semiconductor chip and the bonding wires due to the temperature cycle, abrasion takes place due to the filler with a high degree of hardness, which may cause breakage of the bonding wires and characteristic degradation of the power semiconductor chip.

Embodiments of the present invention provide a semiconductor device excellent in both a long-term reliability and a cooling performance.

According to an embodiment of the invention, a semiconductor device includes a power semiconductor chip having chip electrodes on both surfaces thereof; an insulating substrate having a wiring thin film on a primary surface; a bonding wire; a metal base plate; a resin A that does not contain a thermally-conductive filler; and a resin B that contains a thermally-conductive filler, wherein the power semiconductor chip is placed on the wiring thin film, wherein the bonding wire electrically connects the chip electrode and an electrode other than the chip electrode, wherein the insulating substrate is placed on the metal base plate, wherein a surface of the power semiconductor chip, the surface not being opposed to the wiring thin film, and a surface of the bonding wire are sealed with the resin A, and wherein the resin A is sealed with the resin B.

According to an embodiment of the invention, a surface of the power semiconductor chip mounted within the power semiconductor module, the surface not being opposed to the wiring thin film, and a surface of the bonding wire are sealed with the resin A that does not contain a thermally-conductive filler, and the resin A is sealed with the resin B that contains the thermally-conductive filler. Therefore, because the heat generated from the power semiconductor chip can be dissipated toward the sealing resin, and abrasion of a member due to the filler with a high degree of hardness can be prevented, a cooling performance and a long-term reliability are both established.

DETAILED DESCRIPTION OF ILLUSTRATED EMBODIMENTS

Embodiments are explained with reference to the following working examples.

Working Example 1

Figure 1:
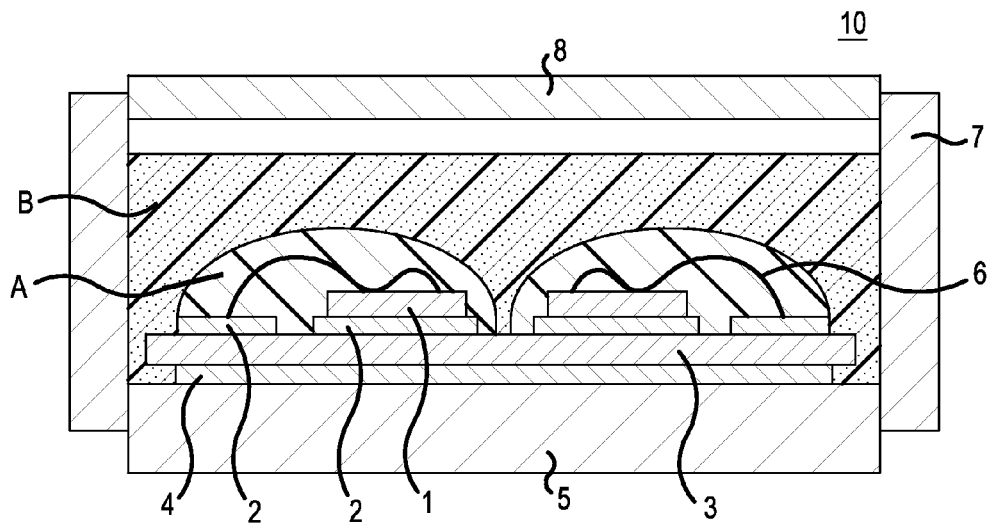
FIG. 1 is a cross-sectional view of a semiconductor device according to a first working example of the present invention.

FIG. 1 is a cross-sectional view of a semiconductor device according to a first working example of the present invention.

In a power semiconductor module 10 illustrated in FIG. 1, power semiconductor chips 1 such as IGBTs, power MOSFETs, and FWDs are bonded by solder (not illustrated) or the like on a wiring thin film 2, which has been pattern-formed on an upper surface of an insulating substrate 3 made of alumina, aluminum nitride, or the like. Incidentally, the wiring thin film 2 is made of copper or copper alloy, which has an excellent electrical conductivity, and can be formed by a so-called direct copper bonding (DCB) method.

In addition, in both surfaces of the power semiconductor chips 1, chip electrodes (not illustrated) having different functions such as an emitter, a collector, and a gate in the case of an IGBT, and a cathode and an anode in the case of an FWD are arranged. Therefore, in addition to chip electrodes arranged in a surface opposed to the wiring thin film 2 bonded by soldering or the like, wirings to other chip electrodes arranged in the opposite surface should also be provided.

Such wirings may be made from the chip electrodes arranged in the opposite surface to electrodes other than the chip electrodes by using bonding wires 6. Here, the bonding wires 6 are made of metal such as copper, aluminum, and gold, or alloys thereof, from a viewpoint of electrical conductivity and workability at the time of bonding. In addition, the electrodes other than the chip electrodes are, for example, electrodes of other semiconductor chips when there are more than one semiconductor chip, in addition to other patterned electrodes explained in the following, and output terminals 9 explained in a third working example.

Here, the wirings are once made to other patterned electrodes of the wiring thin film 2 with the bonding wires 6, and necessary wirings are then made from the other ends of these wiring thin film patterns to the output terminals (not illustrated). By doing so, a length of the bonding wires 6 can be minimized, which is beneficial when a material cost of the bonding wire cannot be negligible (for example, when a gold wire is used).

In addition, in order to ensure the cooling performance for the heat generated from the semiconductor chips 1, the insulating substrate 3 is firmly attached to a metal base plate 5 made of copper, aluminum, or the like, through a metal thin film 4. When solder (not illustrated) is used for firmly attaching, it is difficult to directly firmly attach the solder on the surface of the insulating substrate 3. Therefore, the metal thin film 4 made of copper or copper alloy is added on the surface of the insulating substrate 3. The metal thin film 4 can be formed by the DCB method, as is the case with the wiring thin film 2.

Incidentally, when an adhesive agent is used for firmly attaching the insulating substrate 3 and the metal base plate 5, the metal thin film 4 is not always necessary.

The above configuration and various wirings (not illustrated) are incorporated in a case frame 7, and the inside of the case with them incorporated is locally sealed with the sealing resin A that does not contain the thermally-conductive fillers. This is for protecting the outer surfaces of the bonding wires 6, and the surfaces of the power semiconductor chips 1, the surfaces being not opposed to the wiring thin film 2, from the thermally-conductive fillers that are contained in the sealing resin B and used as the filler. As a sealing material of the sealing resin A, especially, silicone gel is effectively used, and a silicone gel that does not contain any thermally-conductive fillers, except inevitable impurities, may be used. The surfaces of the power semiconductor chips 1, the surfaces being not opposed to the wiring thin film 2, include at least a surface in which the chip electrodes having the bonding wires 6 connected are formed.

Here, the reason for employing the silicone gel as the sealing material is that the gel has a high endurance and a high heat resistance, and can control a filling range as illustrated in FIG. 1 due to its being in gel state. In addition, the inside of the case is sealed with the sealing resin B containing the thermally-conductive fillers so as to cover the sealing resin A. This is for protecting the sealing resin A and other members inside the case from foreign materials and moisture, ensuring an insulating property, and improving the cooling performance for the heat generated from the power semiconductor chips 1. As a sealing material of the sealing resin B, silicone gel may be effectively used.

As the above thermally-conductive fillers of the sealing resin B, granular powders made of inorganic materials such as alumina, silica, silicon carbide, silicon nitride, aluminum nitride, magnesium oxide, diamond, and diamond-like carbon may be used.

Incidentally, it is effective to select an inexpensive material such as aluminum, silica, and diamond-like carbon when prioritizing product costs, and a material with a high thermal conductivity such as silicon carbide, silicon nitride, aluminum nitride, magnesium oxide, and diamond when prioritizing the cooling performance.

In the power semiconductor module 10, a case lid 8 is further placed on an opening surface of the case frame 7. This is for preventing foreign materials and moisture from entering the inside of the power semiconductor module 10 and ensuring the insulating property.

As understood from the above explanations, in this working example, the outer surface of the bonding wires 6 and the surfaces of the power semiconductor chips 1, the surfaces being not opposed to the wiring thin film 2, are locally sealed with the sealing resin A that does not contain the thermally-conductive fillers, and the other parts are sealed with the sealing resin B that contains the thermally-conductive fillers. With this, along with a maximum use of the thermally-conductive fillers, the outer surfaces of the bonding wires 6 and the surfaces of the power semiconductor chips 1, the surfaces being not opposed to the wiring thin film 2, are protected from abrasion deriving from the thermally-conductive fillers. Therefore, the cooling performance is made better while ensuring reliability, which is effective when prioritizing the heat dissipation from the power semiconductor chips 1. Incidentally, in order to enhance the cooling performance, it is effective to add a fin to the metal base plate 5 and to cool the metal base plate 5 and the fin with liquid.

Working Example 2

Figure 2:
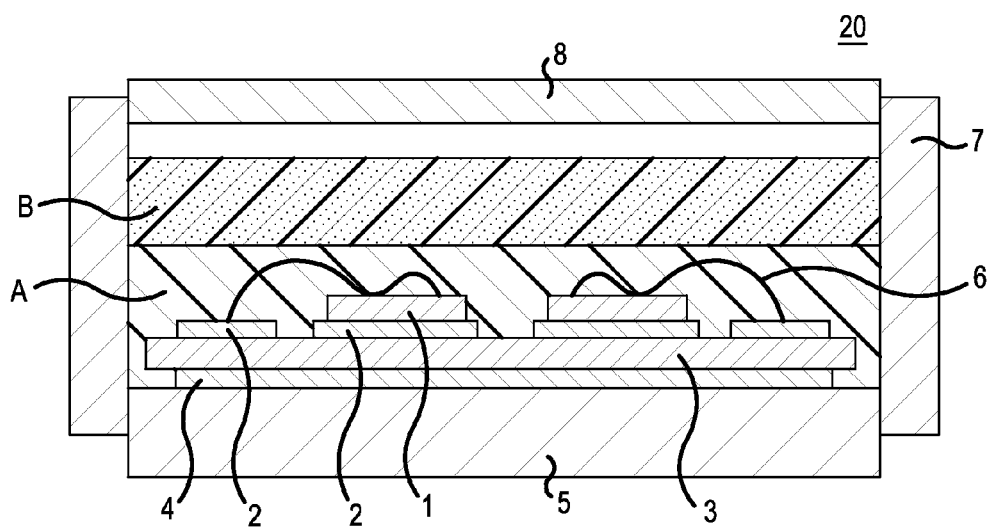
FIG. 2 is a cross-sectional view of a semiconductor device according to a second working example of the present invention.

FIG. 2 is a cross-sectional view of a semiconductor device according to a second working example of the present invention. In a power semiconductor module 20 of this working example, regarding the sealing resins that fill the inside of the case of the power semiconductor module 10 according to the first working example, the inside of the case is equally filled and thus sealed with the sealing resin A that does not contain the thermally-conductive fillers until the bonding wires are entirely immersed therein, rather than locally.

Moreover, in order to entirely seal the surface of the sealing resin A, the sealing resin B that contains the thermally-conductive fillers is filled thereover, thereby to seal, so as to be mutually in a layer-shape. With this, the sealing resin A that does not contain the thermally-conductive fillers is not necessarily locally filled therein, and any measures to control a position of a filling nozzle can be omitted, which is effective when prioritizing a production cost of the power semiconductor module 20.

Working Example 3

Figure 3:
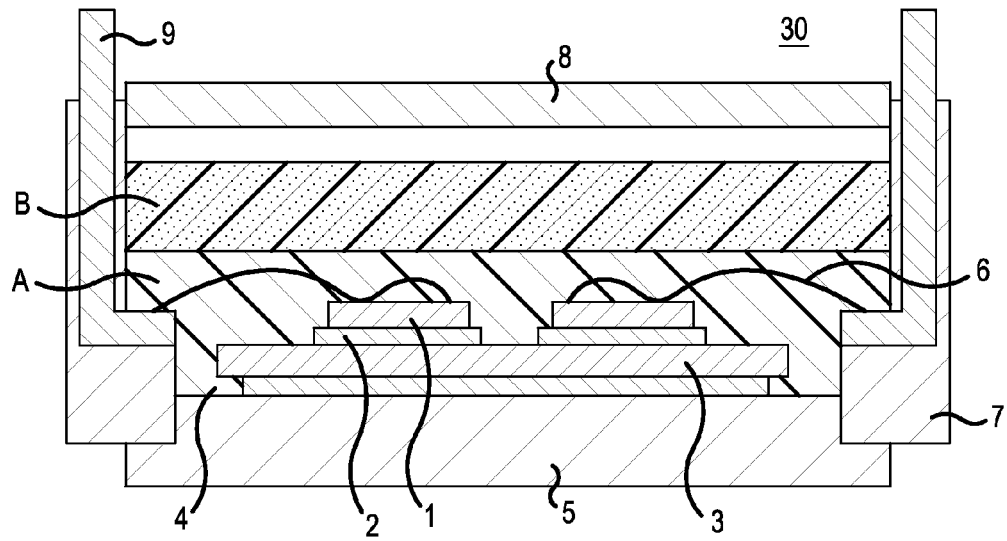
FIG. 3 is a cross-sectional view of a semiconductor device according to a third working example of the present invention.
Figure 4:
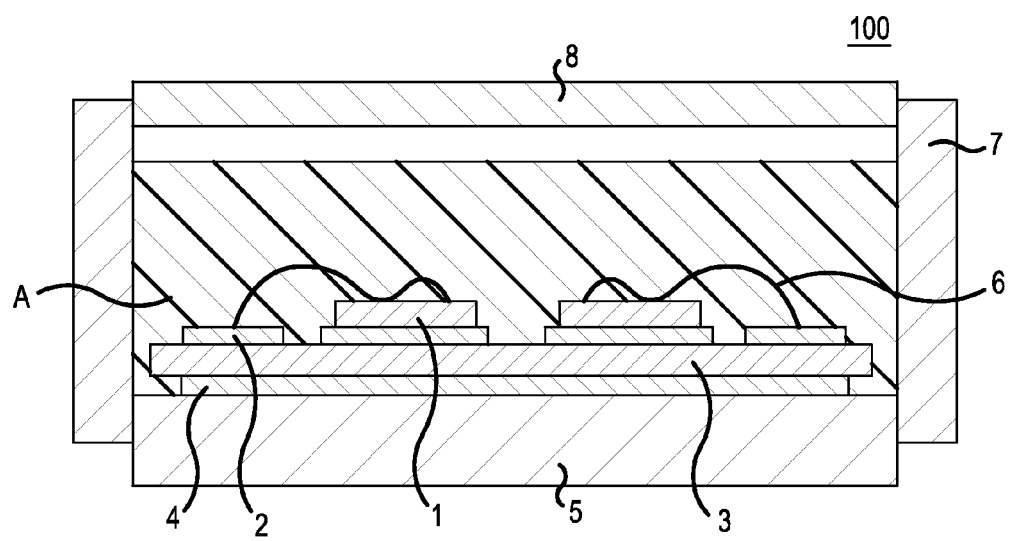
FIG. 4 is a cross-sectional view of a semiconductor device according to a first conventional example.
Figure 5:
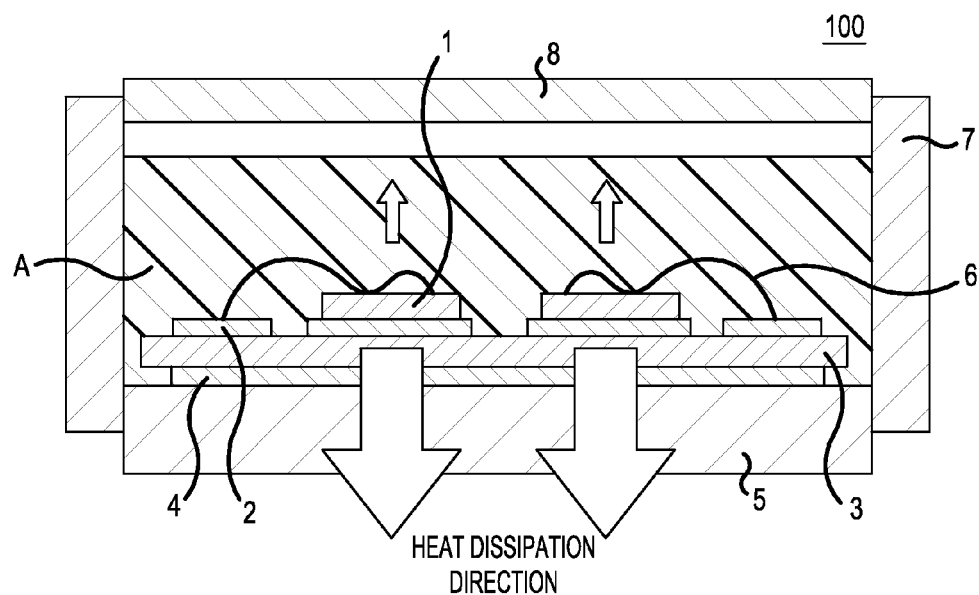
FIG. 5 is a schematic view illustrating a heat dissipation characteristic of the semiconductor device according to the first conventional example.
Figure 6:
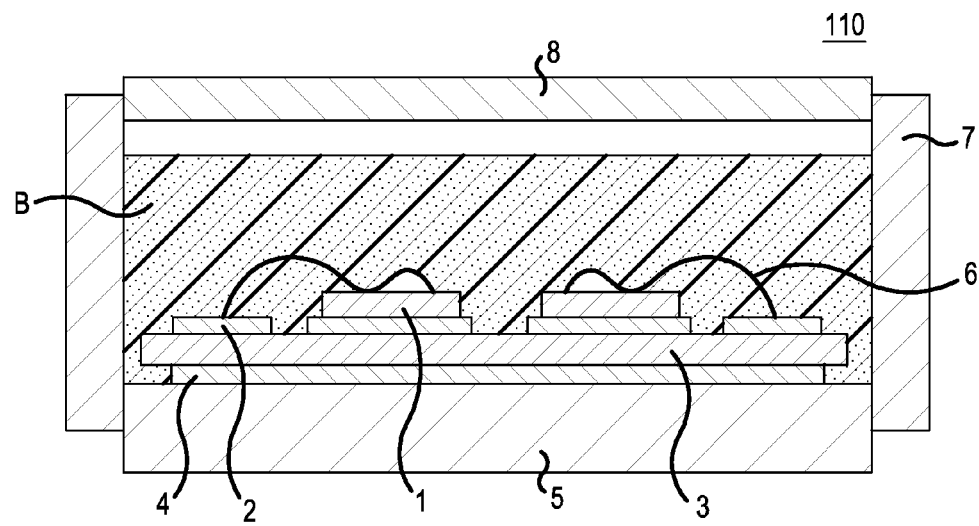
FIG. 6 is a cross-sectional view of a semiconductor device according to a second conventional example.
Figure 7:
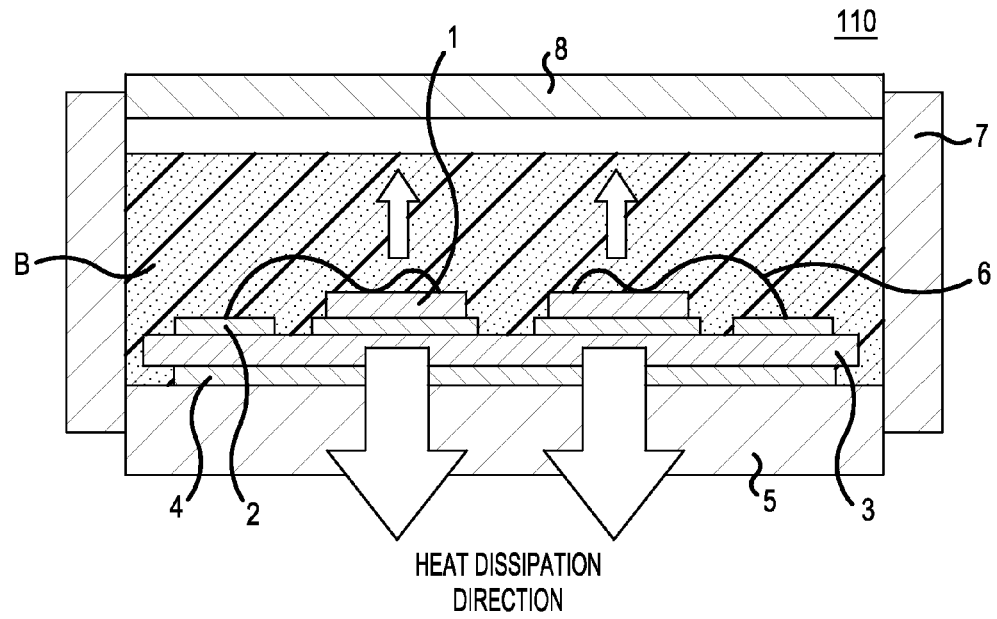
FIG. 7 is a schematic view illustrating a heat dissipation characteristic of the semiconductor device according to the second conventional example.
Figure 8:
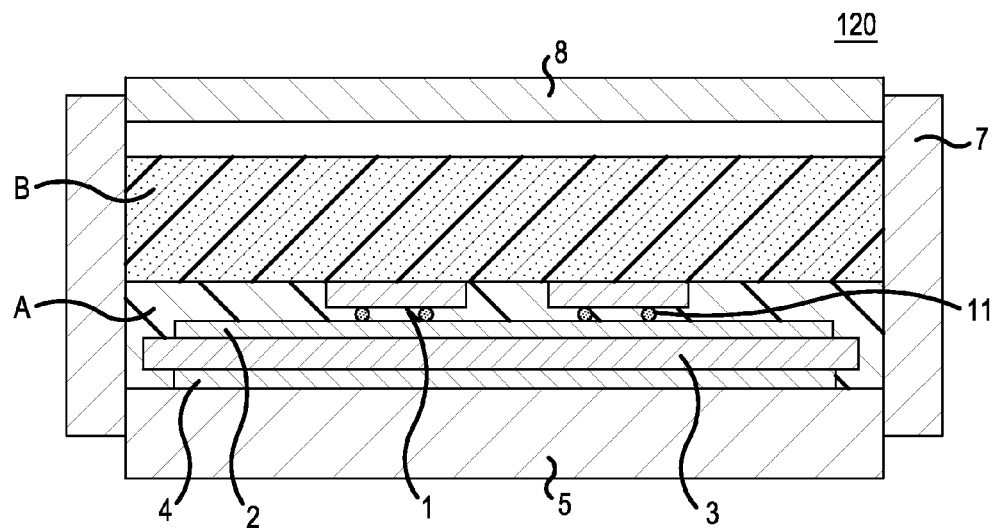
FIG. 8 is a cross-sectional view of a semiconductor device according to a third conventional example.

FIG. 3 is a cross-sectional view of a semiconductor device according to a third working example of the present invention. In a power semiconductor module 30 of this working example, regarding the wirings in the power semiconductor module 20 according to the second working example, the bonding wires 6 are wired from the chip electrodes directly to the output terminals 9. With this, while lengths of the bonding wires 6 become longer, only one process of bonding to the output terminals 9 is needed. This is effective when reduction of the number of the bonding processes matters rather than a material cost of the bonding wires 6.

The invention claimed is:

1. A semiconductor device, comprising:
   a power semiconductor chip having chip electrodes on both surfaces thereof;
   an insulating substrate having a wiring thin film on a primary surface;
   a bonding wire;
   a metal base plate;
   a first resin including silicone gel and not including a thermally-conductive filler; and
   a second resin including silicone gel and a thermally-conductive filler,
   wherein the power semiconductor chip is placed on the wiring thin film,
   wherein the bonding wire electrically connects the chip electrode and an electrode other than the chip electrode,
   wherein the insulating substrate is placed on the metal base plate,
   wherein a surface of the power semiconductor chip not being opposed to the wiring thin film, and a surface of the bonding wire are sealed with the first resin, and
   wherein the first resin is sealed with the second resin.

2. The semiconductor device according to claim 1, wherein the first resin and the second resin are mutually in a layer-shape.

3. The semiconductor device according to claim 1, wherein an inside of a housing composed of the metal base plate, a case frame, and a case lid are filled with the first resin and the second resin.

4. The semiconductor device according to claim 1, wherein the thermally-conductive filler includes one or more of alumina, silica, silicon carbide, silicon nitride, aluminum nitride, magnesium oxide, diamond, and diamond-like carbon.

5. The semiconductor device according to claim 2, wherein the thermally-conductive filler includes one or more of alumina, silica, silicon carbide, silicon nitride, aluminum nitride, magnesium oxide, diamond, and diamond-like carbon.

6. The semiconductor device according to claim 3, wherein the thermally-conductive filler includes one or more of alumina, silica, silicon carbide, silicon nitride, aluminum nitride, magnesium oxide, diamond, and diamond-like carbon.

7. A semiconductor device, comprising:
   a metal base;
   an insulating substrate disposed on the metal base;
   a wiring thin film disposed on the insulating substrate;
   a power semiconductor chip disposed on the wiring thin film and having a first surface facing the wiring thin film, a second surface opposite the first surface, and a chip electrode;
   a bonding wire connected to the chip electrode;

a first resin sealing the bonding wire and the second surface of the power semiconductor chip, the first resin including silicone gel and being a thermally-conductive-filler-free resin; and a second resin including silicone gel and a thermally-conductive filler, the second resin sealing the first resin.

8. The semiconductor device according to claim 7, wherein the first resin exposes a portion of the insulating substrate, and the second resin contacts the first resin and the exposed portion of the insulating substrate.

9. The semiconductor device according to claim 7, wherein the second resin contacts the first resin without contacting the insulating substrate.

10. The semiconductor device according to claim 7, wherein the thermally-conductive filler includes one or more of alumina, silica, silicon carbide, silicon nitride, aluminum nitride, magnesium oxide, diamond, and diamond-like carbon.

11. The semiconductor device according to claim 7, further comprising another power semiconductor chip spaced apart from the power semiconductor chip, wherein the first resin includes a first portion sealing the bonding wire and the second surface of the power semiconductor chip and a second portion spaced apart from the first portion and sealing the another power semiconductor chip, and wherein the second resin is disposed between the first portion and the second portion of the first resin.

12. The semiconductor device according to claim 11, wherein the second resin contacts a portion of the insulating substrate disposed between the first portion and the second portion of the first resin.

13. The semiconductor device according to claim 1, further comprising another power semiconductor chip spaced apart from the power semiconductor chip, wherein the first resin includes a first portion sealing the surface of the bonding wire and the surface of the power semiconductor chip and a second portion spaced apart from the first portion and sealing the another power semiconductor chip, and wherein the second resin is disposed between the first portion and the second portion of the first resin.

14. The semiconductor device according to claim 13, wherein the second resin contacts a portion of the insulating substrate disposed between the first portion and the second portion of the first resin.

* * * * *